United States Patent
Constantinidis et al.

(10) Patent No.: US 6,642,783 B2
(45) Date of Patent: Nov. 4, 2003

(54) AMPLIFICATION DEVICE WITH OPTIMIZED LINEARITY

(75) Inventors: Nicolas Constantinidis, Cresserons (FR); Guillaume Crinon, Douvres la Delivrande (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/950,851

(22) Filed: Sep. 12, 2001

(65) Prior Publication Data

US 2002/0079961 A1 Jun. 27, 2002

(30) Foreign Application Priority Data

Sep. 12, 2000 (FR) .............................................. 00 11590

(51) Int. Cl.$^7$ ................................................. H03F 1/24
(52) U.S. Cl. .......................... 330/98; 330/10; 330/51; 330/134; 330/139; 330/310
(58) Field of Search ........................ 330/98, 139, 310, 330/10, 51

(56) References Cited

U.S. PATENT DOCUMENTS

| | | | | | |
|---|---|---|---|---|---|
| 3,863,173 A | * | 1/1975 | Scheib et al. | ................. | 330/98 |
| 4,132,957 A | * | 1/1979 | Hekimian et al. | ............ | 330/51 |
| 4,320,351 A | * | 3/1982 | Brown et al. | ................ | 330/260 |
| 4,555,668 A | * | 11/1985 | Gregorian et al. | ............ | 330/9 |
| 4,897,617 A | * | 1/1990 | Milberger et al. | .......... | 330/277 |
| 5,708,376 A | * | 1/1998 | Ikeda | ........................... | 327/50 |
| 6,201,442 B1 | * | 3/2001 | James et al. | ................ | 330/107 |
| 6,281,757 B1 | * | 8/2001 | Tomiyama | ................... | 330/310 |

OTHER PUBLICATIONS

"Design with Operational Amplifiers and Analog Integrated Circuits" by Sergio Franco, McGraw–Hill International, 1988, pp. 222–224.

* cited by examiner

Primary Examiner—Michael Tokar
Assistant Examiner—Linh Van Nguyen
(74) Attorney, Agent, or Firm—Laurie E. Gathman

(57) ABSTRACT

The invention relates to an amplification device AD, comprising a first and a second amplifier AMP1 and AMP2, arranged in cascade, each amplifier being provided with a feedback loop Zi (where i=1 or 2) and having a gain proper Gi equal to Ai/(1+Ai.Zi). In accordance with the invention, the value of the inverse of the gain proper Gi of the first amplifier AMP1 is substantially equal to three times the value of the inverse of the gain proper G2 of the second amplifier AMP2 raised to the power of three: $(1/G1)=3/(G2)^3$. Such a choice provides the amplification device AD with an optimum linearity.

4 Claims, 2 Drawing Sheets

AMPLIFICATION DEVICE WITH OPTIMIZED LINEARITY

FIELD OF THE INVENTION

The invention relates to an amplification device comprising a first and a second amplifier arranged in cascade, each amplifier having a gain proper and being provided with a feedback loop.

BACKGROUND OF THE INVENTION

Such a device is described on page 223 of the manual "Design with Operational Amplifiers and Analog Integrated Circuits" by Mr. Sergio Franco, published by McGraw-Hill International.

In this document, it is recommended to equitably distribute the gain of the device as a whole among the two amplifiers, i.e. assign identical values to the gain proper of the first amplifier and the second amplifier, with a view to obtaining the largest possible passband for the device.

This document does not make mention of the linearity characteristics of the amplification device. Now, in most applications where amplification of a signal is necessary, the value of the amplified signal should develop linearly with respect to the value of the signal to be amplified, which means that the risk of distortions being caused in the amplified signal leading to changes in the information that it conveys has to be accepted.

SUMMARY OF THE INVENTION

It is an object of the invention to optimize the performance in terms of linearity of an amplification device comprising two stages, while preserving an acceptable passband.

The inventors have actually discovered that the gain distribution customarily recommended to optimize the passband does not lead to the best possible linearity for the amplification device. In accordance with this invention, an amplification device as described in the opening paragraph is characterized in that the value of the inverse of the gain proper of the first amplifier is substantially equal to three times the value of the inverse of the gain proper of the second amplifier raised to the third power.

It will be demonstrated hereinafter that said choice causes the value of the linearity of the amplification device to be maximized.

Of course, numerous embodiments of the first and second amplifiers are possible and known to those skilled in the art.

In accordance with one of these embodiments, each amplifier comprises an operational inverting amplifier.

In accordance with another embodiment, each amplifier includes an operational non-inverting amplifier.

In other embodiments, each amplifier may itself be composed of a plurality of amplifiers arranged in cascade.

The scope of the invention is so wide that it includes innumerable applications, such as, for example, the amplification of signals within television receivers, decoder housings or even within radiotelephones. Thus, the invention also relates to a device for receiving radioelectric signals, comprising:

an antenna system for receiving such a signal and transforming it to an electronic signal, commonly referred to as radio signal, a frequency converter intended to supply an intermediate signal, representative of the radio signal, having a so-called intermediate frequency, an amplification device as claimed in claim 1, intended to supply an amplified intermediate signal, a demodulator intended to demodulate the signal supplied by the amplification device, and a signal processor intended to exploit the demodulated signal.

BRIEF DESCRIPTION OF THE DRAWINGS

These and other aspects of the invention will be apparent from and elucidated with reference to the non-limitative exemplary embodiment and the annexed drawings, wherein.

DETAILED DESCRIPTION OF THE INVENTION

Figure 1:
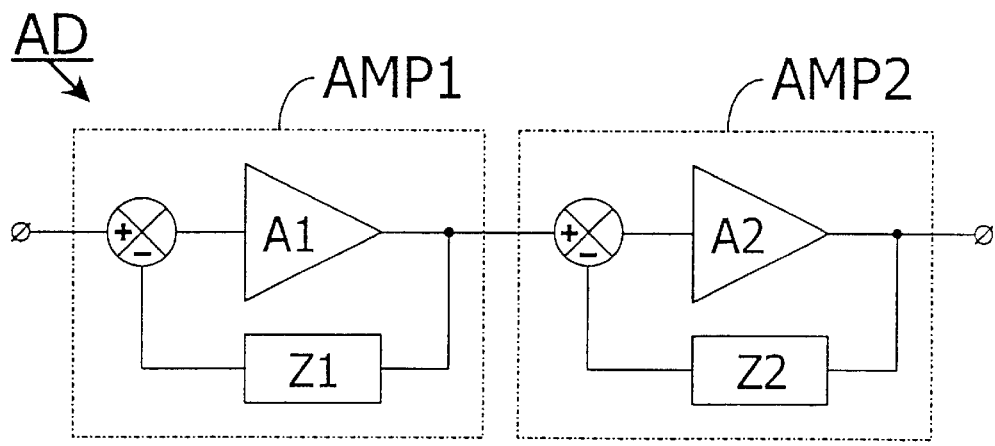
FIG. 1 is a block diagram of an amplification device wherein the invention is implemented.

FIG. 1 diagrammatically shows an amplification device AD comprising a first and a second amplifier AMP1 and AMP2 arranged in cascade. Each amplifier AMPi includes an amplification stage with a gain A1 and is provided with a feedback loop with a loop gain Z1. Each amplifier AMP1 thus has a gain proper Gi which is equal to Ai/(1+Ai.Zi), which is defined as the ratio between the amplitudes of the output signals and the input signals of this amplifier AMPi.

The inventors have found out that the linearity LIN of the amplification device AD can be derived from the following formula:

$$(1/LIN)^2 = (1/LIN1)^2 + (G1/LIN2)^2,$$

where LINi is the linearity of the $i^{th}$ amplifier, which can be expressed as follows:

$$LINi = (LINAi).(Ai.Zi)^{3/2},$$

LINAi being the linearity of the amplification stage included in the amplifier Ai.

If the amplification stages of the first and second amplifiers are similar and their gain proper is identical and equal to A, the value of which is large as compared to the values of the gains of the loops Z1 and Z2, i.e. the gain proper Gi of each amplifier AMPi is equal to 1/Zi, it can be derived from the foregoing that:

$$(1/LIN)^2 = (1/LINA^2.A^3).[(1/Z1^3) + (G1^2/Z2^3)].$$

If it is assumed that $Z = Z1.Z2$, then $LIN^2 = K.[(Z1^3.Z^3)/(Z1^4 + Z^3)]$, where K is a constant which does not have any effect on the demonstration.

As the gain of the amplification device is fixed when said device is being conceived, the derivative, in relation to Z1, of the preceding expression is written as $(K/D).Z.Z1^2.[3.Z^3 - Z1^4]$, where D represents a denominator whose value is always positive.

The above-defined derivative is positive if $Z1 < (3.Z^3)^{1/4}$ and negative if $Z1 > (3.Z^3)^{1/4}$. Thus, to the value $Z1 = (3.Z^3)^{1/4}$ corresponds a maximum of the linearity LIN of the amplification device, i.e. also to $Z1 = 3.(Z2)^3$ or $(1/G1) = 3/(G2)^3$.

The amplification device AD thus has an optimum linearity if three times the value of the inverse of the gain proper G2 of the second amplifier AMP2 raised to the third power is chosen for the value of the inverse of the gain proper G1 of the first amplifier AMP1.

By way of example, if the value of the overall gain of the amplification device AD is set at 20 dB, this means that G1.G2=10, and hence Z=Z1.Z2=0.1, taking into account the preceding assumptions. The maximum linearity LIN of the amplification device AD is obtained for a value of Z1=0.234, which implies that Z2=0.427. The value of the gain G1 of the first amplifier AMP1 will thus be close to 4.27, while the value of the gain G2 of the second amplifier AMP2 will be close to 2.34.

In the known device, where an equitable distribution of the overall gain of the device among the two amplifiers AMP1 and AMP2 is recommended, the value of the gain of each of said amplifiers would have been close to 3.33, which value would not enable the best possible linearity to be attained for the amplification device.

It has been found, however, that the values of the gain of the first and second amplifiers AMP1 and AMP2 recommended in accordance with the invention are so close to those recommended in the known devices that the width of the passband of the device in accordance with the invention is acceptable.

Figure 2:
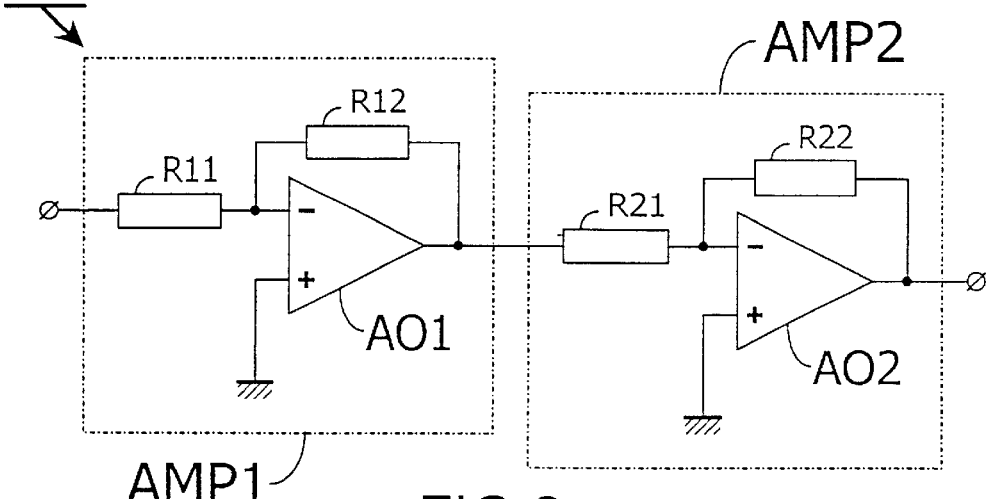
FIG. 2 is a functional diagram of an embodiment in accordance with the invention.

FIG. 2 is a functional diagram of an embodiment of an amplification device AD in accordance with the invention. In this embodiment, each amplifier AMPi includes an operational inverting amplifier AOi:

each operational amplifier AOi actually comprises a non-inverting input terminal, which is connected to a reference voltage terminal, in this case forming ground, an inverting input terminal connected to an input of the amplifier AMPi via a first resistance Ri1, and to an output terminal of the amplifier AMPi, formed by an output of the operational amplifier AOi, via a second resistance Ri2.

It is known that the absolute value of the gain proper Gi of each amplifier AMPi in accordance with this embodiment is written as Ri2/Ri1. To revert to the previously described example, in accordance with the invention, the following ratios are selected to obtain an optimum linearity for the amplification device AD:

R12/R11=4.27 and

R22/R21=2.34.

Figure 3:
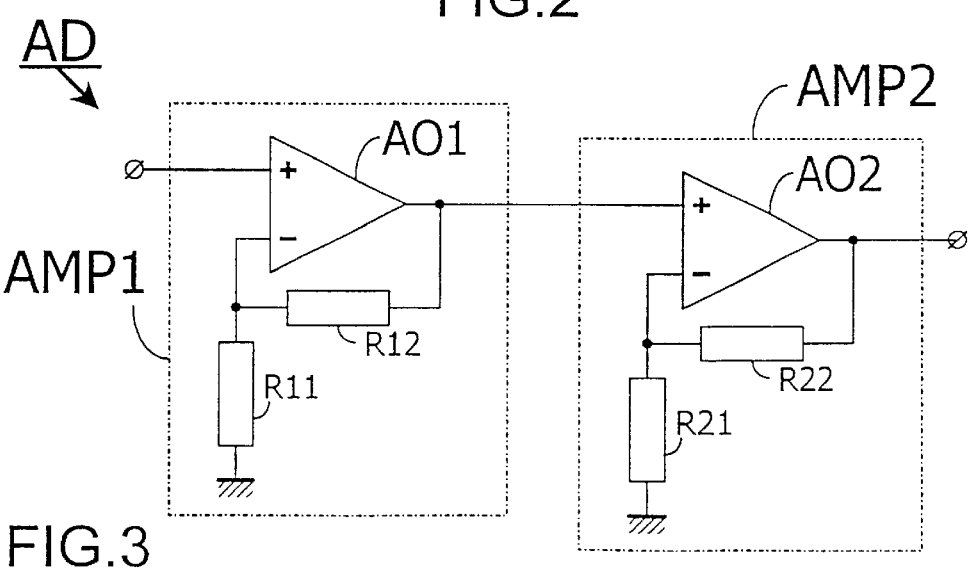
FIG. 3 is a functional diagram of another embodiment in accordance with the invention.

FIG. 3 is a functional diagram of another embodiment of an amplification device AD in accordance with the invention. In this embodiment, each amplifier AMPi comprises an operational non-inverting amplifier AOi:

each operational amplifier AOi actually includes a non-inverting input terminal forming an input of the amplifier AMPi, an inverting input terminal connected to a reference-voltage terminal, in this case forming ground, via a first resistance Ri1 and to an output terminal of the amplifier AMPi, formed by an output of the operational amplifier AOi, via a second resistance Ri2.

It is known that the gain proper Gi of each amplifier AMPi in accordance with this embodiment is written as 1+(Ri2/Ri1). To revert to the above-described example, the following ratios are chosen in accordance with the invention to obtain an optimum linearity for the amplification device AD:

R12/R11=3.27 and,

R22/R21=1.34.

Figure 4:
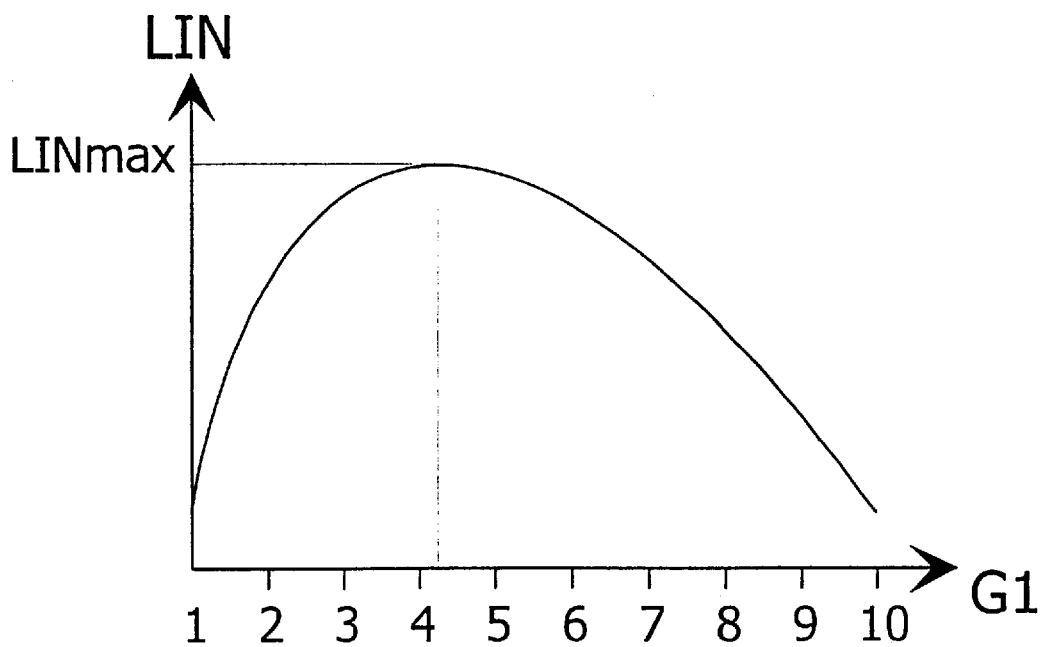
FIG. 4 shows a curve indicating the variations in linearity as a function of the gain of the first amplifier.

FIG. 4 shows the variations in linearity LIN of the amplification device shown in FIG. 1 as a function of the variations of the gain proper G1 of the first amplifier AMP1. This curve, which is shaped like an asymmetrical cup, has a maximum value at G1=4.27 in the case shown here, where the overall gain of the amplification device is fixed at 20 dB, i.e. 0<G1<10.

Figure 5:
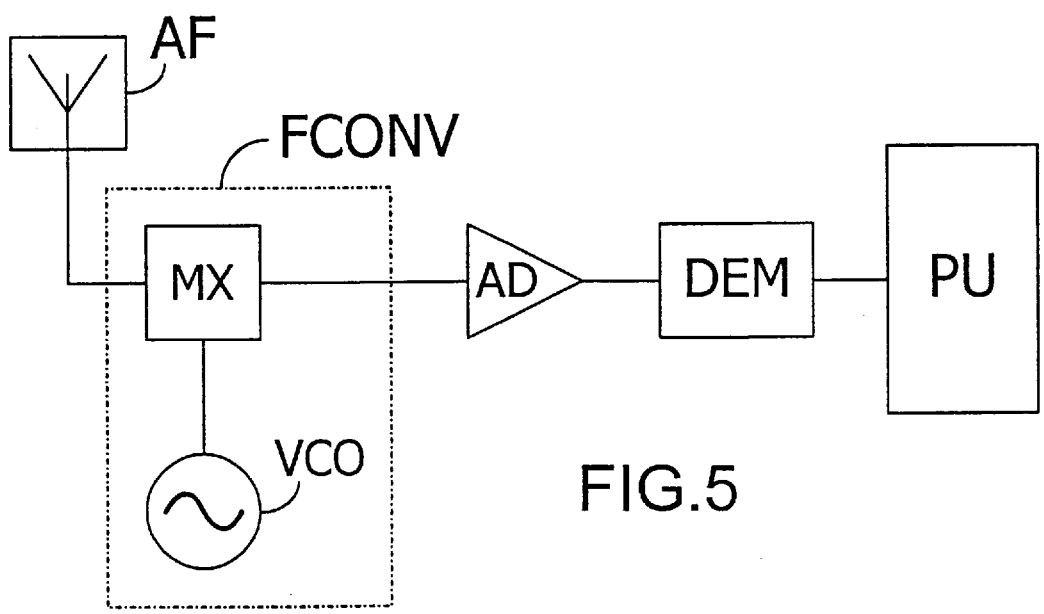
FIG. 5 is a functional diagram showing a receiver wherein the invention is implemented.

FIG. 5 shows one of the many possible embodiments of the invention. This Figure shows a device for receiving radioelectric signals, comprising:

an antenna system AF for receiving such a signal and transforming it to an electronic signal, commonly referred to as radio signal, a frequency converter FCONV intended to supply an intermediate signal, representative of the radio signal, having a so-called intermediate frequency, an amplification device AD as described hereinabove, intended to supply an amplified intermediate signal, a demodulator DEM intended to demodulate the signal supplied by the amplification device AD, and a signal processor PU intended to exploit the demodulated signal.

The use of an amplification device AD in accordance with the invention makes it possible to ensure that the signals received by the signal processor PU will be free from any distortion, and that the signal processor PU will extract information from these signals which is in conformity with the initially transmitted information.

What is claimed is:

1. An amplification device comprising a first and a second amplifier that are arranged in cascade, each amplifier having a gain proper and being provided with a feedback loop, wherein a value of an inverse of the gain proper of the first amplifier is substantially equal to three times a value of an inverse of the gain proper of the second amplifier raised to the power of three.

2. An amplification device as claimed in claim 1, wherein each amplifier comprises an inverting operational amplifier.

3. An amplification device as claimed in claim 1, wherein each amplifier comprises a non-inverting operational amplifier.

4. A device for receiving radioelectric signals, comprising:

an antenna system receiving a signal and transforming the received signal into an electronic signal;

a frequency converter supplying an intermediate signal representative of the electronic signal having an intermediate frequency;

an amplification device as claimed in claim 1 amplifying the intermediate signal;

a demodulator intended demodulating the amplified intermediate signal supplied by the amplification device; and a signal processor exploiting the demodulated signal.

* * * * *